(12) United States Patent
Asano et al.

(10) Patent No.: US 12,283,574 B2
(45) Date of Patent: Apr. 22, 2025

(54) SEMICONDUCTOR MODULE

(71) Applicant: FUJI ELECTRIC CO., LTD., Kanagawa (JP)

(72) Inventors: Tamiko Asano, Hino (JP); Michio Tamate, Hachioji (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 499 days.

(21) Appl. No.: 17/844,055

(22) Filed: Jun. 20, 2022

(65) Prior Publication Data
US 2023/0060703 A1   Mar. 2, 2023

(30) Foreign Application Priority Data

Aug. 27, 2021  (JP) .................................. 2021-139389

(51) Int. Cl.
*H01L 23/00* (2006.01)
*H01L 23/498* (2006.01)
*H01L 25/07* (2006.01)

(52) U.S. Cl.
CPC ...... *H01L 25/072* (2013.01); *H01L 23/49844* (2013.01); *H01L 24/48* (2013.01); *H01L 2224/48155* (2013.01)

(58) Field of Classification Search
CPC . H01L 25/072; H01L 23/49844; H01L 24/48; H01L 2224/48155; H01L 25/18; H01L 24/45; H01L 24/49; H01L 2224/45124; H01L 2224/45147; H01L 2224/48091; H01L 2224/48111; H01L 2224/48137; H01L 2224/48227; H01L 2224/49113; H01L 2224/73265; H01L 2924/19105; H01L 2924/19107
See application file for complete search history.

(56) References Cited

U.S. PATENT DOCUMENTS

2016/0336268 A1   11/2016 Kamikura

FOREIGN PATENT DOCUMENTS

| JP | 2007181351 A | 7/2007 |
| JP | 6053668 B2 | 12/2016 |
| JP | 6169250 B2 | 7/2017 |

*Primary Examiner* — Elias Ullah

(57) ABSTRACT

Provided is a semiconductor module having a P-side arm circuit and an N-side arm circuit. The semiconductor module comprises: a P terminal on a high-voltage side; an N terminal on a low-voltage side; a plurality of wiring patterns separated from each other; and a transistor and a diode connected in parallel in each of the circuits, wherein the plurality of wiring patterns include a first wiring pattern, a second wiring pattern, and a third wiring pattern, the P terminal is connected to the first wiring pattern, the N terminal is connected to the second wiring pattern, an anode electrode of the diode of the N-side arm circuit is arranged above the second wiring pattern and is connected to the second wiring pattern, and an anode electrode of the diode of the P-side arm circuit is arranged above the third wiring pattern and is connected to the third wiring pattern.

20 Claims, 18 Drawing Sheets

SEMICONDUCTOR MODULE

The contents of the following Japanese patent application are incorporated herein by reference:
NO. 2021-139389 filed in JP on Aug. 27, 2021.

BACKGROUND

1. Technical Field

The present invention relates to a semiconductor module.

2. Related Art

In a semiconductor module equipped with a semiconductor chip such as an Insulated Gate Bipolar Transistor (IGBT), there has been a problem of generation of a high frequency common-mode current caused by an imbalance of a ground capacitance and of generation of a radiation noise. A semiconductor module to reduce a radiation noise has been known (see Patent Documents 1 to 3, for example). Moreover, it has been known that a parasitic component of a semiconductor module can be regarded as a bridge circuit (see Reference Documents 1 to 3, for example).

Patent Document 1: Japanese Patent No. 6053668
Patent Document 2: Japanese Patent No. 6169250
Patent Document 3: Japanese Patent Application Publication No. 2007-181351
Reference Document 1: Atsuhiro Takahashi and 5 other authors, "Reducing Common-Mode Noise of Power Converter Using Impedance Balance Method", The Institute of Electronics, Information and Communication Engineers, Environmental Electromagnetic Engineering Workshop, Jul. 11, 2013, IEICE-113, No. 122, p. 45-50
Reference Document 2: Chiharu Kyotani and 6 other authors, "A Study on Reduction of Common-Mode Conducted EMI in Mhz Range for Synchronous DC-DC Buck Converter", The Institute of Electrical Engineers of Japan, Dec. 11, 2020, 2020(57): 73-78
Reference Document 3: Taiki Nishimoto and 4 other authors, "Common-Mode Noise Reduction by Impedance Balance Method for Asymmetric Switching Power Supply Circuit", Journal B of The Institute of Electronics, Information and Communication Engineers, Mar. 1, 2019, Vol. J102-B, No. 3, p. 184-193

DESCRIPTION OF EXEMPLARY EMBODIMENTS

Figure 1:
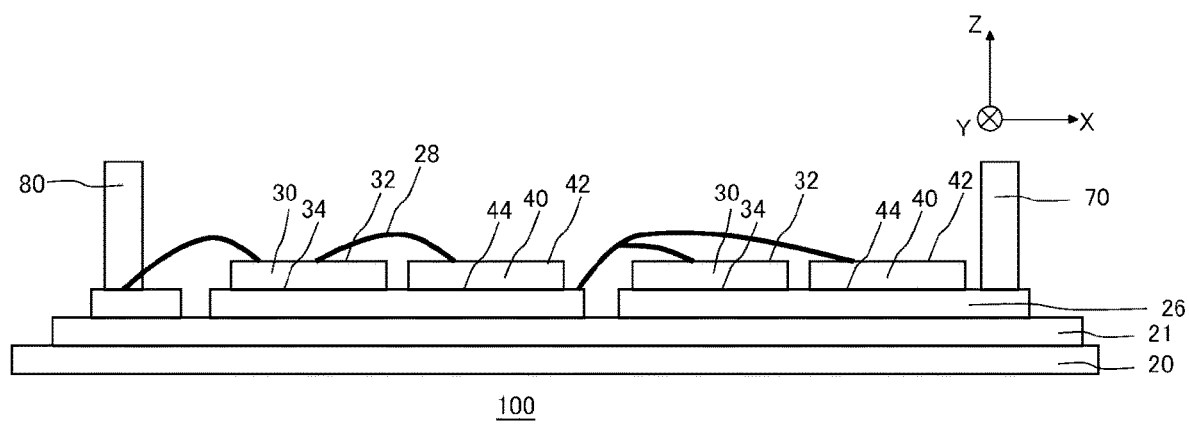
FIG. 1 shows one example of a semiconductor module 100 according to a comparative example.

Hereinafter, the present invention will be described through embodiments of the invention, but the following embodiments do not limit the claimed invention. In addition, not all combinations of features described in the embodiments necessarily have to be essential to solving means of the invention. It should be noted that, in this specification and the drawings, the same reference numeral will be given to elements having substantially the same function and configuration to thereby leave out redundant explanation thereof, and illustration of elements that are not directly related to the present invention will be left out. Moreover, for elements having substantially the same function and configuration in one drawing, a reference numeral may be given to an element as a representative and may not be given to the others.

In this specification, one side in a direction parallel to a depth direction of a semiconductor chip is referred to as "upper", and the other side as "lower". One of two main surfaces of a substrate, a layer, or other members is referred to as an upper surface, and the other surface as a lower surface. "Upward" and "downward" directions are not limited to a direction of gravitational force or a direction at the time of mounting a semiconductor module.

In this specification, technical matters may be described by using orthogonal coordinate axes of an X axis, a Y axis, and a Z axis. The orthogonal coordinate axes merely specify relative positions of components, and do not limit a specific direction. For example, the Z axis does not limitedly indicate a height direction with respect to a ground. It should be noted that a +Z axis direction and a −Z axis direction are opposite to each other. When a direction is described as a Z axis direction without any positive or negative sign, this means that the direction is parallel to a +Z axis and a −Z axis. In this specification, orthogonal axes parallel to an upper surface and a lower surface of the semiconductor chip are defined as the X axis and the Y axis. Moreover, an axis perpendicular to the upper surface and the lower surface of the semiconductor chip is defined as the Z axis. In this specification, the Z axis direction may be referred to as a depth direction. Moreover, in this specification, a direction parallel to the upper surface and the lower surface of the semiconductor chip including the X axis and the Y axis may be referred to as a horizontal direction.

When referred to as "same" or "equal" in this specification, this may include a case where there is an error caused by production tolerance or the like. The error is, for example, within 10%.

FIG. 1 shows one example of a semiconductor module 100 according to a comparative example. The semiconductor module 100 may function as a power conversion apparatus such as an inverter. In FIG. 1, the semiconductor module 100 includes a base substrate 20, an insulating substrate 21, a plurality of wiring patterns 26, a plurality of wires 28, a plurality of diodes 30, a plurality of transistors 40, a P terminal 70, and an N terminal 80. FIG. 1 schematically shows the semiconductor module 100.

The semiconductor module 100 includes one or more of the insulating substrate 21. One surface of the insulating substrate 21 is provided with a predetermined wiring pattern 26, while the other surface of the insulating substrate 21 is provided with the base substrate 20. The insulating substrate 21 is, for example, silicon nitride ceramics, aluminum nitride ceramics, or the like. The wiring pattern 26 is, for example, a copper sheet or an aluminum sheet. The wiring pattern 26 may be configured by directly bonding or bonding via a brazing material layer a plated copper sheet or aluminum sheet to the insulating substrate 21. The base substrate 20 is, for example, a copper sheet. A lower surface of the base substrate 20 may be provided with a cooler.

The wiring pattern 26 is provided with a transistor 40 or a diode 30. The transistor 40 and the diode 30 are each one example of the semiconductor chip. The transistor 40 or the diode 30 is provided on an upper surface of the wiring pattern 26. A bonding material (not shown) such as solder may be provided between the transistor 40 or the diode 30 and the wiring pattern 26. Moreover, the transistor 40 or the diode 30 may be protected by a sealing resin (not shown).

In this example, the transistor 40 is an IGBT. The transistor 40 is a vertical chip. The transistor 40 has an emitter electrode 42 and a collector electrode 44. In FIG. 1, the emitter electrode 42 is formed on an upper surface of the transistor 40. Moreover, in FIG. 1, the collector electrode 44 is formed on a lower surface of the transistor 40. The transistor 40 is connected to the wiring pattern 26 by the electrode formed on the lower surface and is connected to a wire 28 by the electrode formed on the upper surface. Moreover, the transistor 40 may be a MOS transistor. The wire 28 may be formed by wire bonding. The wire 28 is, for example, copper, aluminum, or the like.

In this example, the diode 30 is a Free Wheel Diode (FWD). The diode 30 is a vertical chip. The diode 30 has an anode electrode 32 and a cathode electrode 34. In FIG. 1, the anode electrode 32 is formed on an upper surface of the diode 30. Moreover, in FIG. 1, the cathode electrode 34 is formed on a lower surface of the diode 30. The diode 30 is connected to the wiring pattern 26 by the electrode formed on the lower surface and is connected to the wire 28 by the electrode formed on the upper surface.

The semiconductor module 100 includes the P terminal 70 and the N terminal 80. The P terminal 70 is on a high-voltage side. The P terminal 70 is provided on the wiring pattern 26. The N terminal 80 is on a low-voltage side. The N terminal 80 is provided on the wiring pattern 26. The P terminal 70 and the N terminal 80 may be a conductive member such as copper.

Figure 2:
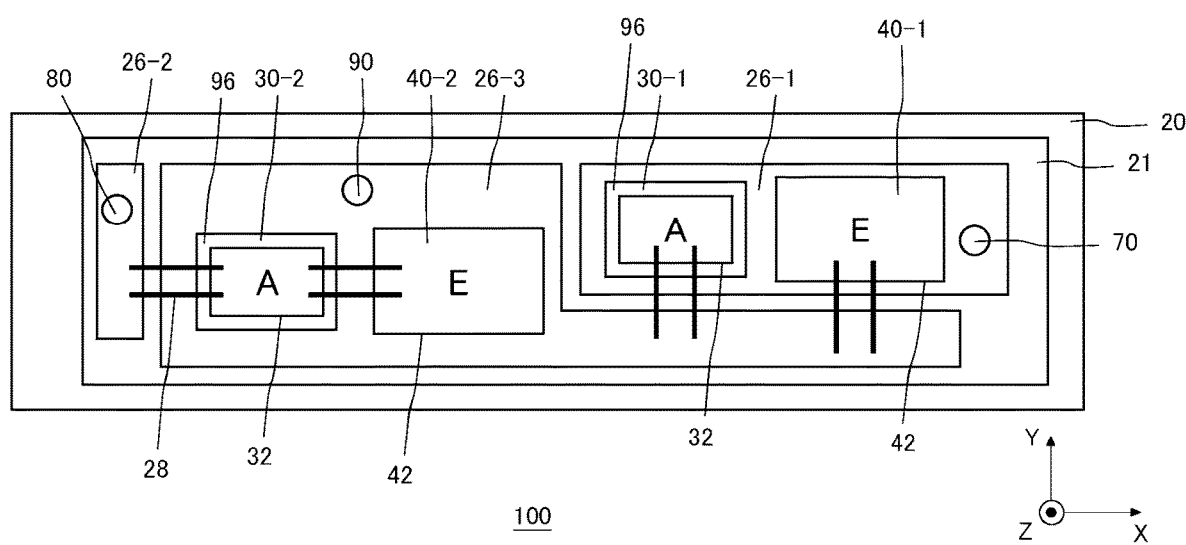
FIG. 2 shows one example of the semiconductor module 100 in a top view.

FIG. 2 shows one example of the semiconductor module 100 in a top view. FIG. 2 shows arrangement of the base substrate 20, the insulating substrate 21, the wiring pattern 26, the wire 28, the diode 30, the transistor 40, the P terminal 70, the N terminal 80, and an output terminal 90, in a top view.

The wiring pattern 26 includes a plurality of wiring patterns separated from each other. In FIG. 2, the wiring pattern 26 includes a wiring pattern 26-1, a wiring pattern 26-2, and a wiring pattern 26-3. The wiring pattern 26-1 is one example of a first wiring pattern. The wiring pattern 26-2 is one example of a second wiring pattern. The wiring pattern 26-3 is one example of a third wiring pattern. The P terminal 70 is provided on the wiring pattern 26-1 and is connected to the wiring pattern 26-1. The N terminal 80 is provided on the wiring pattern 26-2 and is connected to the wiring pattern 26-2.

The semiconductor module 100 includes the output terminal 90. The semiconductor module 100 outputs a predetermined voltage to the outside via the output terminal 90. The output terminal 90 may output the voltage to the outside. The output terminal 90 is provided on the wiring pattern 26-3. The output terminal 90 is connected to the wiring pattern 26-3. The output terminal 90 may be a conductive member such as copper. It should be noted that illustration of the output terminal 90 is omitted in FIG. 1.

In FIG. 2, the transistor 40 includes a transistor 40-1 and a transistor 40-2. The transistor 40-1 is provided above the wiring pattern 26-1. The transistor 40-1 may be provided on the wiring pattern 26-1. In this example, the collector electrode 44 of the transistor 40-1 is connected to the wiring pattern 26-1. Moreover, in this example, the emitter electrode 42 of the transistor 40-1 is exposed in a top view. FIG. 2, the emitter electrode 42 of the transistor 40 is represented by "E". The emitter electrode 42 of the transistor 40-1 is connected to the wiring pattern 26-3 via the wire 28. A plurality of the transistor 40-1 may be provided.

The transistor 40-2 is provided above the wiring pattern 26-3. The transistor 40-2 may be provided on the wiring pattern 26-3. In this example, the collector electrode 44 of the transistor 40-2 is connected to the wiring pattern 26-3. Moreover, in this example, the emitter electrode 42 of the transistor 40-2 is exposed in a top view. The emitter electrode 42 of the transistor 40-2 is connected to the wiring pattern 26-2 via the wire 28 and the anode electrode 32 of a diode 30-2. A plurality of the transistor 40-2 may be provided.

It should be noted that the upper surface of the transistor 40 may be provided with a gate electrode. The gate electrode of the transistor 40 may be connected to a gate terminal (not shown in FIG. 1 and FIG. 2) via the wire 28 or the like.

In FIG. 2, the diode 30 includes a diode 30-1 and the diode 30-2. The diode 30-1 is provided above the wiring pattern 26-1. The diode 30-1 may be provided on the wiring pattern 26-1. In this example, the cathode electrode 34 of the diode 30-1 is connected to the wiring pattern 26-1. Moreover, in this example, the anode electrode 32 of the diode 30-1 is exposed in a top view. In FIG. 2, the anode electrode 32 of the diode 30 is represented by "A". The anode electrode 32 of the diode 30-1 is connected to the wiring pattern 26-3 via the wire 28. Moreover, a guard ring 96 is formed on the upper surface of the diode 30. The guard ring 96 is provided to ensure a breakdown voltage. The guard ring 96 may be provided so as to enclose the anode electrode 32. A plurality of the diode 30-1 may be provided.

The diode 30-2 is provided above the wiring pattern 26-3. The diode 30-2 may be provided on the wiring pattern 26-3. In this example, the cathode electrode 34 of the diode 30-2 is connected to the wiring pattern 26-3. Moreover, in this example, the anode electrode 32 of the diode 30-2 is exposed in a top view. The anode electrode 32 of the diode 30-2 is connected to the wiring pattern 26-2 via the wire 28. A plurality of the diode 30-2 may be provided.

Figure 3:
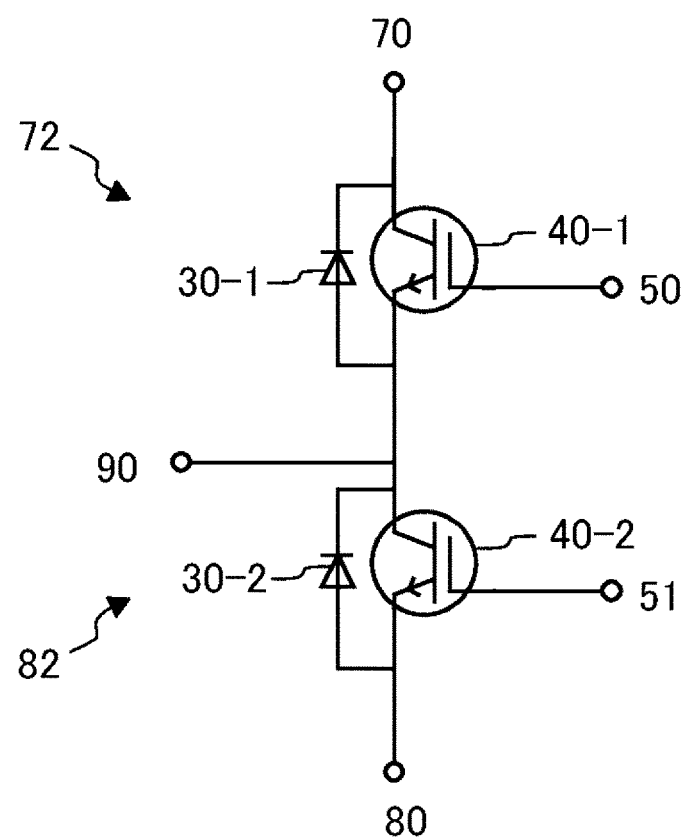
FIG. 3 shows one example of a circuit configuration of the semiconductor module 100.

FIG. 3 shows one example of a circuit configuration of the semiconductor module 100. FIG. 3 shows a gate terminal 50 and a gate terminal 51 as a gate terminal. The semiconductor module 100 has a P-side arm circuit 72 and an N-side arm circuit 82. The P-side arm circuit 72 is provided on the P terminal 70 side. The P-side arm circuit 72 is composed of the transistor 40-1 and the diode 30-1. The N-side arm circuit 82 is provided on the N terminal 80 side. The N-side arm circuit 82 is composed of the transistor 40-2 and the diode 30-2. For each of the P-side arm circuit 72 and the N-side arm circuit 82, the transistor 40 and the diode 30 are connected in parallel.

The collector electrode 44 of the transistor 40-1 is connected to the P terminal 70. The emitter electrode 42 of the transistor 40-1 is connected to the output terminal 90. A gate electrode of the transistor 40-1 is connected to the gate terminal 50. A gate voltage is applied between the gate terminal 50 and the output terminal 90.

The collector electrode 44 of the transistor 40-2 is connected to the output terminal 90. The emitter electrode 42 of the transistor 40-2 is connected to the N terminal 80. A gate electrode of the transistor 40-2 is connected to the gate terminal 51. A gate voltage is applied between the gate terminal 51 and the N terminal 80.

The cathode electrode 34 of the diode 30-1 is connected to the P terminal 70. The anode electrode 32 of the diode 30-1 is connected to the output terminal 90.

The cathode electrode 34 of the diode 30-2 is connected to the output terminal 90. The anode electrode 32 of the diode 30-2 is connected to the N terminal 80.

Figure 4:
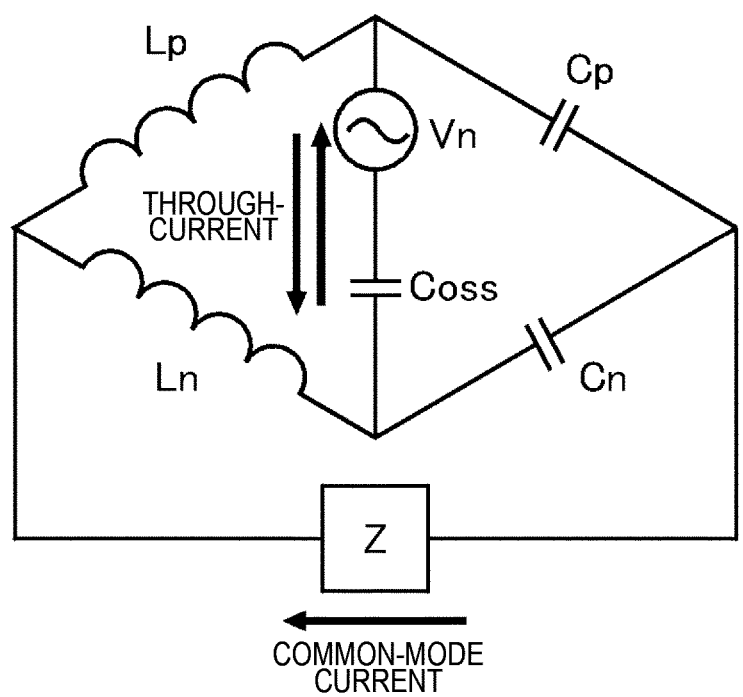
FIG. 4 shows one example of a parasitic component of the semiconductor module 100.

FIG. 4 shows one example of a parasitic component of the semiconductor module 100. As shown in FIG. 4, the parasitic component of the semiconductor module 100 can be regarded as a bridge circuit (see Reference Documents 1 to 3). The P terminal 70 and the wiring pattern 26-1 are defined as a P line. The N terminal 80 and the wiring pattern 26-2 are defined as an N line. A parasitic inductance of the P line is defined as $L_p$, while a stray capacitance between the P line and a ground (the base substrate 20 or the like) is defined as $C_p$. Moreover, a parasitic inductance of the N line is defined as $L_n$, while a stray capacitance between the N line and the ground (the base substrate 20 or the like) is defined as $C_n$. Moreover, a voltage at the time of switching of the transistor 40 or the like is defined as $V_n$, while a stray capacitance of the transistor 40 or the like is defined as $C_{oss}$. A predetermined impedance is defined as Z.

In this bridge circuit, a through-current flows through the stray capacitance $C_{oss}$ each time a switching operation is performed. This through-current generates a common-mode current flowing through a resistance component R. The common-mode current causes a radiation noise. When a bridge equilibrium condition (the following Expression 1) is established, the generation of the common-mode current is suppressed and the radiation noise can be reduced.

$$L_p \cdot C_p = L_n \cdot C_n \quad \text{(Expression 1)}$$

While $L_p$ and $L_n$ can be relatively easily adjusted, adjustment of $C_p$ and $C_n$ is more difficult than that of $L_p$ and $L_n$. In FIG. 2, an area of the wiring pattern 26-1 in a top view is larger than an area of the wiring pattern 26-2 in a top view. Therefore, there is often a case where $C_p \gg C_n$, and Expression 1 is less likely to be established. Therefore, the reduction of the radiation noise is more difficult.

Figure 5:
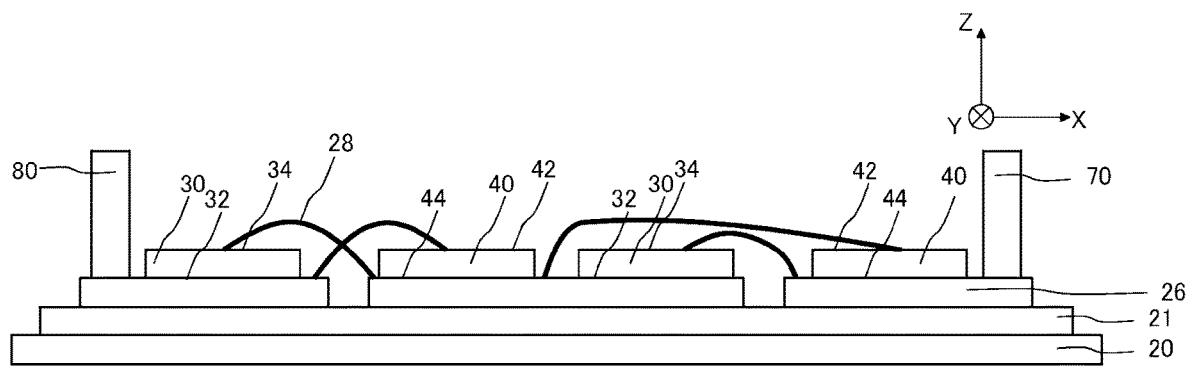
FIG. 5 shows one example of a semiconductor module 200 according to an example embodiment.

FIG. 5 shows one example of a semiconductor module 200 according to an example embodiment. The semiconductor module 200 in FIG. 5 is different from the semiconductor module 100 in FIG. 1 in that the former has an anode electrode 32 of a diode 30 formed on a lower surface.

In FIG. 5, the anode electrode 32 is formed on the lower surface of the diode 30. Moreover, in FIG. 5, a cathode electrode 34 is formed on an upper surface of the diode 30. The diode 30 is connected to a wiring pattern 26 by the electrode formed on the lower surface and is connected to a wire 28 by the electrode formed on the upper surface.

Figure 6:
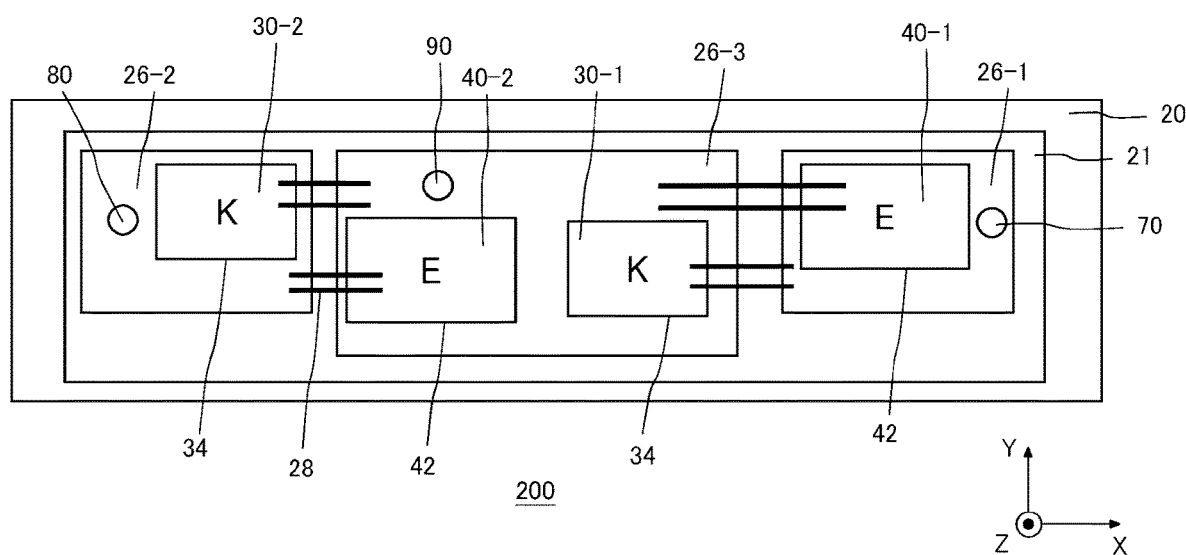
FIG. 6 shows one example of the semiconductor module 200 in a top view.

FIG. 6 shows one example of the semiconductor module 200 in a top view. FIG. 6 shows arrangement of a base substrate 20, an insulating substrate 21, the wiring pattern 26, the wire 28, the diode 30, a transistor 40, a P terminal 70, an N terminal 80, and an output terminal 90, in a top view. For a configuration shown in FIG. 6 that is similar to the configuration shown in FIG. 2, description will be omitted.

A transistor 40-1 is provided above a wiring pattern 26-1. The transistor 40-1 may be provided on the wiring pattern 26-1. In this example, a collector electrode 44 of the transistor 40-1 is connected to the wiring pattern 26-1. Moreover, in this example, an emitter electrode 42 of the transistor 40-1 is exposed in a top view. The emitter electrode 42 of the transistor 40-1 is connected to a wiring pattern 26-3 via the wire 28.

A transistor 40-2 is provided above the wiring pattern 26-3. The transistor 40-2 may be provided on the wiring pattern 26-3. In this example, the collector electrode 44 of the transistor 40-2 is connected to the wiring pattern 26-3. Moreover, in this example, the emitter electrode 42 of the transistor 40-2 is exposed in a top view. The emitter electrode 42 of the transistor 40-2 is connected to a wiring pattern 26-2 via the wire 28.

A diode 30-1 is provided above the wiring pattern 26-3. The diode 30-1 may be provided on the wiring pattern 26-3. In this example, the anode electrode 32 of the diode 30-1 is connected to the wiring pattern 26-3. Moreover, in this example, the cathode electrode 34 of the diode 30-1 is exposed in a top view. In FIG. 6, the cathode electrode 34 of the diode 30 is represented by "K". The cathode electrode 34 of the diode 30-1 is connected to the wiring pattern 26-1 via the wire 28.

A diode 30-2 is provided above the wiring pattern 26-2. The diode 30-2 may be provided on the wiring pattern 26-2. In this example, the anode electrode 32 of the diode 30-2 is connected to the wiring pattern 26-2. Moreover, in this example, the cathode electrode 34 of the diode 30-2 is exposed in a top view. The cathode electrode 34 of the diode 30-2 is connected to the wiring pattern 26-3 via the wire 28.

The semiconductor module 200 has the same circuit configuration as the circuit configuration of the semiconductor module 100 in FIG. 3. That is, the semiconductor module 200 has a P-side arm circuit 72 and an N-side arm circuit 82. The P-side arm circuit 72 is composed of the transistor 40-1 and the diode 30-1. The N-side arm circuit 82 is composed of the transistor 40-2 and the diode 30-2.

In this example, the anode electrode 32 of the diode 30-2 of the N-side arm circuit 82 is arranged above the wiring pattern 26-2 and is connected to the wiring pattern 26-2. Moreover, the anode electrode 32 of the diode 30-1 of the P-side arm circuit 72 is arranged above the wiring pattern 26-3 and is connected to the wiring pattern 26-3. With such a configuration, an area of the wiring pattern 26-1 in a top view and an area of the wiring pattern 26-2 in a top view can be nearly equal. As such, $C_p = C_n$, and adjusting $L_p$ and $L_n$ can establish Expression 1. Therefore, a radiation noise can be reduced. The radiation noise can be reduced only by replacement of the diode 30 without mounting any additional component on the semiconductor module 200.

The collector electrode 44 of the transistor 40-1 of the P-side arm circuit 72 may be arranged above the wiring pattern 26-1 and connected to the wiring pattern 26-1. The collector electrode 44 of the transistor 40-2 of the N-side arm circuit 82 may be arranged above a wiring pattern different from the wiring pattern 26-1 and connected to the wiring pattern. In this example, the collector electrode 44 of the transistor 40-2 of the N-side arm circuit 82 is arranged above the wiring pattern 26-3 and is connected to the wiring pattern 26-3. With such arrangement of the transistor 40-1 and the transistor 40-2, the circuit configuration of the semiconductor module 200 can be the same as in FIG. 3.

The wire 28 may connect the cathode electrode 34 of the diode 30-2 of the N-side arm circuit 82 and the wiring pattern 26-3. The wire 28 may connect the cathode electrode 34 of the diode 30-1 of the P-side arm circuit 72 and the wiring pattern 26-1. With such arrangement of the wire 28, the circuit configuration of the semiconductor module 200 can be the same as in FIG. 3.

The total number of chips for the transistor 40 and the diode 30 provided to the wiring pattern 26-1 may be the same as the total number of chips for the transistor 40 and the diode 30 provided to the wiring pattern 26-2. In this example, the total number of chips for the transistor 40 and the diode 30 provided to the wiring pattern 26-1 is one. In FIG. 6, one transistor 40-1 is provided on the wiring pattern 26-1. Moreover, in this example, the total number of chips for the transistor 40 and the diode 30 provided to the wiring pattern 26-2 is one. In FIG. 6, one diode 30-2 is provided on the wiring pattern 26-2. The total numbers of chips for the transistor 40 and the diode 30 are the same for the wiring pattern 26-1 and the wiring pattern 26-2, so that the area of the wiring pattern 26-1 in a top view and the area of the wiring pattern 26-2 in a top view can be easily equal.

Figure 7:
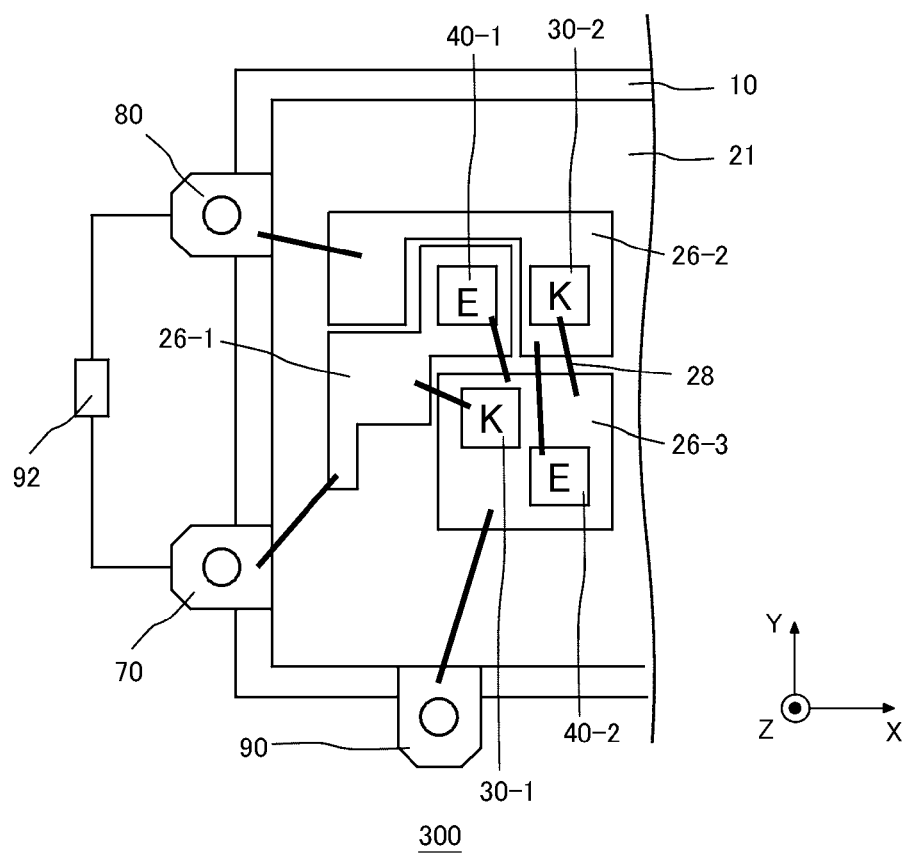
FIG. 7 shows one example of a semiconductor module 300 according to an example embodiment.

FIG. 7 shows one example of a semiconductor module 300 according to an example embodiment. FIG. 7 shows the semiconductor module 300 in a top view. In FIG. 7, the semiconductor module 300 includes a resin case 10, an insulating substrate 21, a plurality of wiring patterns 26, a plurality of wires 28, a plurality of diodes 30, a plurality of transistors 40, a P terminal 70, an N terminal 80, and an output terminal 90. For the same reference numerals in the semiconductor module 300 as those in the semiconductor module 100 and the semiconductor module 200, description will be omitted. The semiconductor module 300 has the same circuit configuration as those of the semiconductor module 100 and the semiconductor module 200. A base substrate may be provided below the insulating substrate 21. The total numbers of chips for a transistor 40 and a diode 30 can be the same for a wiring pattern 26-1 and a wiring pattern 26-2 in the semiconductor module 300, so that an area of the wiring pattern 26-1 in a top view and an area of the wiring pattern 26-2 in a top view can be easily equal.

The resin case 10 is provided so as to enclose a space accommodating the transistor 40 or the diode 30. The insulating substrate 21 may be provided below the resin case 10. In this example, the resin case 10 is molded from a resin such as a thermosetting resin that can be formed by injection molding or an ultraviolet setting resin that can be formed by UV molding. The resin may include, for example, one or more polymer materials selected from polyphenylene sulfide (PPS) resin, polybutylene terephthalate (PBT) resin, polyamide (PA) resin, acrylonitrile butadiene styrene (ABS) resin, acrylic resin, and the like. Moreover, the P terminal 70, the N terminal 80, and the output terminal 90 are provided to the resin case 10.

A capacitor 92 is provided outside the semiconductor module 300. The capacitor 92 is provided to protect a circuit of the semiconductor module 300. The capacitor 92 may be provided between the P terminal 70 and the N terminal 80. In consideration of a parasitic inductance for this case, a component of the parasitic inductance is up to a position where the capacitor 92 is provided. Therefore, Lp and Ln of Expression 1 may significantly differ, and Expression 1 is less likely to be established.

Figure 8:
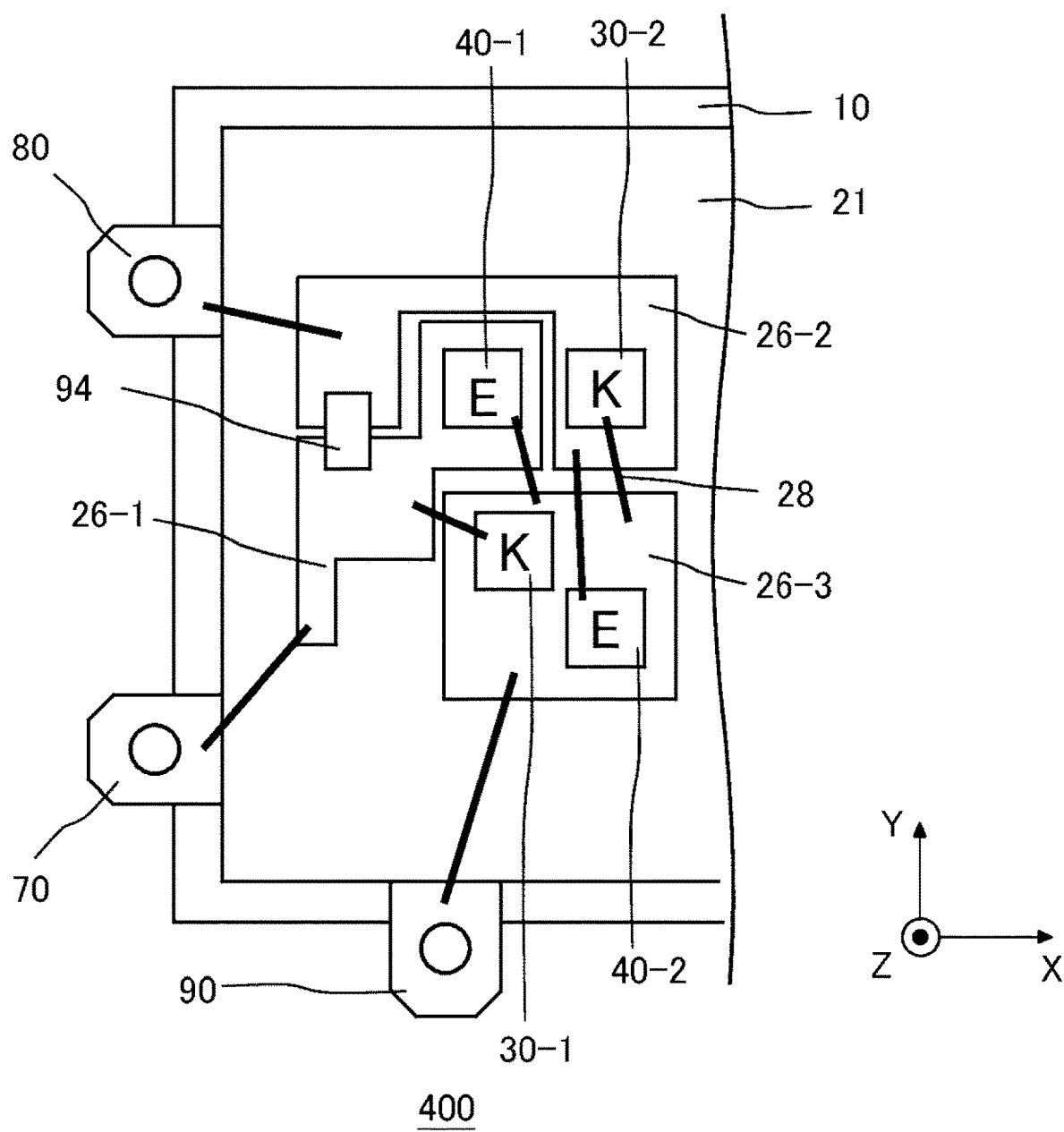
FIG. 8 shows one example of a semiconductor module 400 according to an example embodiment.

FIG. 8 shows one example of a semiconductor module 400 according to an example embodiment. The semiconductor module 400 in FIG. 8 is different from the semiconductor module 300 in FIG. 7 in that the former includes a chip capacitor 94. Except for that configuration, the semiconductor module 400 in FIG. 8 may have the same configuration as that of the semiconductor module 300 in FIG. 7.

The chip capacitor 94 is provided above a wiring pattern 26. The chip capacitor 94 may be provided above a wiring pattern 26-1. The chip capacitor 94 may be provided on the wiring pattern 26-1. The chip capacitor 94 may be provided above a wiring pattern 26-2. The chip capacitor 94 may be provided on the wiring pattern 26-2. The chip capacitor 94 may be provided across the wiring pattern 26-1 and the wiring pattern 26-2. The chip capacitor 94 is provided to protect a circuit of the semiconductor module 400. It should be noted that a capacitor 92, whose illustration is omitted in FIG. 8, may be provided outside as in FIG. 7.

An impedance of the chip capacitor 94 is preferably sufficiently smaller than an impedance of a circuit farther upstream than the chip capacitor 94 in a radiation noise band. Therefore, the circuit farther upstream than the chip capacitor 94 can be regarded as a short circuit at a high frequency, and a region constituting a bridge circuit can be limited to a region farther downstream than the chip capacitor 94. As a result, Expression 1 is more easily established, and a radiation noise can be reduced.

Figure 9:
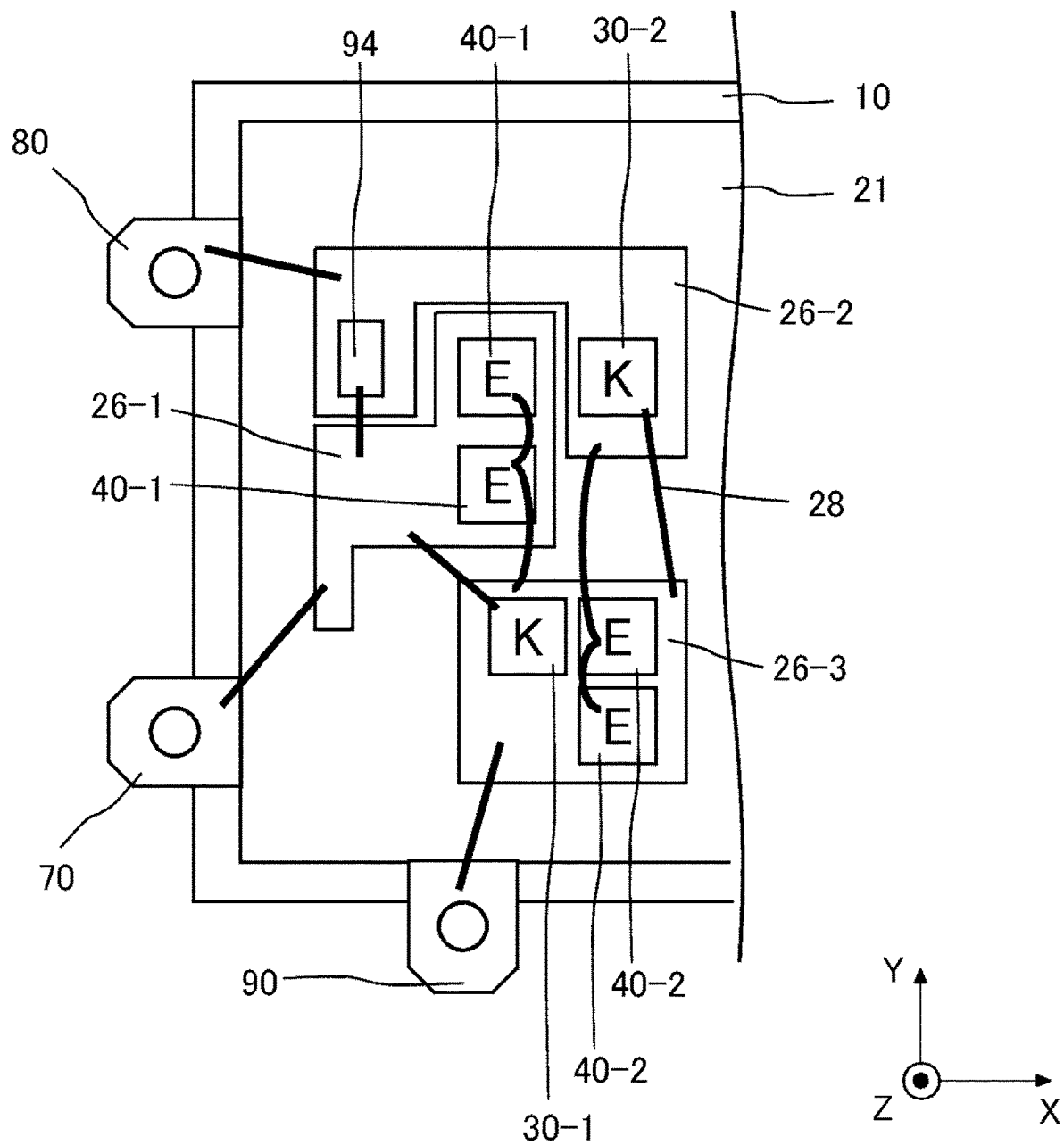
FIG. 9 shows one example of a semiconductor module 500 according to an example embodiment.

FIG. 9 shows one example of a semiconductor module 500 according to an example embodiment. The semiconductor module 500 in FIG. 9 is different from the semiconductor module 400 in FIG. 8 in arrangement of a chip capacitor 94. Moreover, the semiconductor module 500 in FIG. 9 is different from the semiconductor module 400 in FIG. 8 in the number of chips for a transistor 40. Except for that configuration, the semiconductor module 500 in FIG. 9 may have the same configuration as that of the semiconductor module 400 in FIG. 8.

A plurality of transistors 40-1 may be provided above a wiring pattern 26-1. In this example, two transistors 40-1 are provided above the wiring pattern 26-1. The two transistors 40-1 may be provided on the wiring pattern 26-1. In this example, collector electrodes 44 of the two transistors 40-1 are connected to the wiring pattern 26-1. Moreover, in this example, emitter electrodes 42 of the two transistors 40-1 are exposed in a top view. In FIG. 9, the emitter electrodes 42 of the two transistors 40-1 are connected to a wiring pattern 26-3 via one wire 28.

A plurality of transistors 40-2 may be provided above the wiring pattern 26-3. In this example, two transistors 40-2 are provided above the wiring pattern 26-3. The two transistors 40-2 may be provided on the wiring pattern 26-3. In this example, collector electrodes 44 of the two transistors 40-2 are connected to the wiring pattern 26-3. Moreover, in this example, emitter electrodes 42 of the two transistors 40-2 are exposed in a top view. In FIG. 9, the emitter electrodes 42 of the two transistors 40-2 are connected to a wiring pattern 26-2 via one wire 28.

The chip capacitor 94 may be provided above the wiring pattern 26-2. The chip capacitor 94 may be provided on the wiring pattern 26-2. The chip capacitor 94 may not be provided above the wiring pattern 26-1. The chip capacitor 94 may be connected to the wiring pattern 26-1 via a wire 28.

In this example, the total number of chips for the transistor 40, a diode 30, and the chip capacitor 94 provided to the wiring pattern 26-1 is the same as the total number of chips for the transistor 40, the diode 30, and the chip capacitor 94 provided to the wiring pattern 26-2. In this example, the total number of chips for the transistor 40, the diode 30, and the chip capacitor 94 provided to the wiring pattern 26-1 is two. In FIG. 9, the two transistors 40-1 are provided on the wiring pattern 26-1. Moreover, in this example, the total number of chips for the transistor 40, the diode 30, and the chip capacitor 94 provided to the wiring pattern 26-2 is two. In FIG. 9, one diode 30-2 and one chip capacitor 94 are provided on the wiring pattern 26-2. The total numbers of chips for the transistor 40, the diode 30, and the chip capacitor 94 are the same for the wiring pattern 26-1 and the wiring pattern 26-2, so that an area of the wiring pattern 26-1 in a top view and an area of the wiring pattern 26-2 in a top view can be easily equal. It should be noted that the number of transistors 40 on the wiring pattern 26-1 may be one and the number of transistors on the wiring pattern 26-3 may be one as in FIG. 8. In this case, the number of transistors 40 on the wiring pattern 26-1 is one, the number of transistors 40 and the number of diodes 30 on the wiring pattern 26-3 are both one, the number of diodes 30 and the number of chip capacitors 94 on the wiring pattern 26-2 are both one. Since plane areas of the diode 30 and the chip capacitor 94 are often smaller than that of the transistor 40, there is one element on the wiring pattern 26-1 and there are two elements on the wiring pattern 26-2. However, a plane area between the wiring pattern 26-1 and the wiring pattern 26-2 can be more easily equal.

Figure 10:
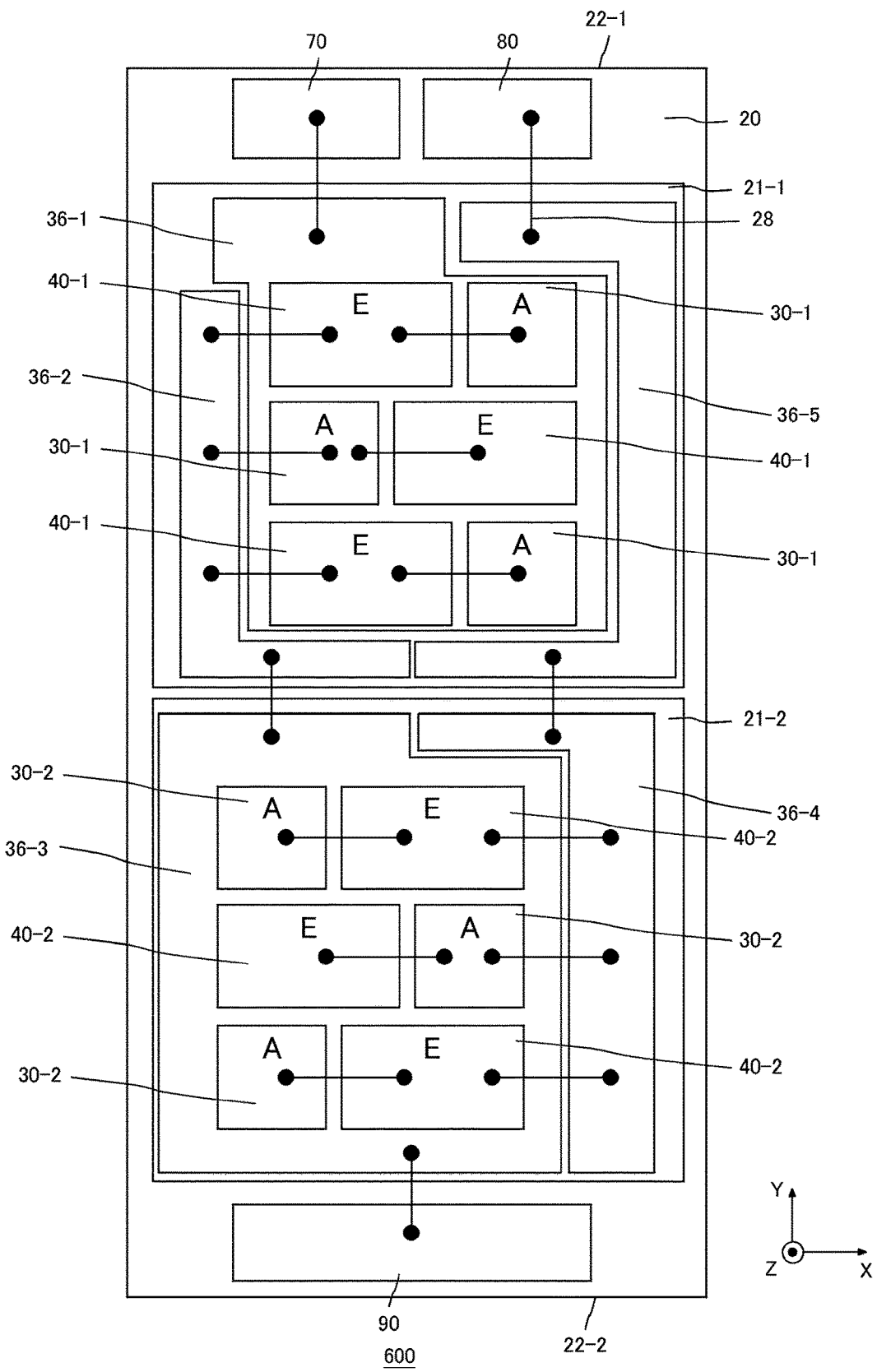
FIG. 10 shows one example of a semiconductor module 600 according to a comparative example.

FIG. 10 shows one example of a semiconductor module 600 according to a comparative example. FIG. 10 shows arrangement of a base substrate 20, an insulating substrate 21, a wire 28, a diode 30, a wiring pattern 36, a transistor 40, a P terminal 70, an N terminal 80, and an output terminal 90, in a top view. A P-side arm circuit of the semiconductor module 600 is composed of three transistors 40-1 and three diodes 30-1. An N-side arm circuit of the semiconductor module 600 is composed of three transistors 40-2 and three diodes 30-2.

The base substrate 20 has end sides 22 in a top view. The base substrate 20 in this example has an end side 22-1 (one example of one end side) and an end side 22-2 (one example of the other end side) facing each other in a top view. In FIG. 1, the end side 22-1 and the end side 22-2 are facing each other in a Y axis direction. The end side 22-1 is provided on a positive side in the Y axis direction. On the other hand, the end side 22-2 is provided on a negative side in the Y axis direction.

In this example, the semiconductor module 600 includes two insulating substrates 21 (an insulating substrate 21-1, an insulating substrate 21-2). One surface of each of the insulating substrates 21 is provided with a predetermined wiring pattern 36. The other surface of each of the insulating substrates 21 is provided with the base substrate 20. Each of the insulating substrates 21 may be provided above the base substrate 20. The insulating substrate 21-1 of the two insulating substrates 21 is provided on the end side 22-1 side. Being provided on the end side 22-1 side means that a shortest distance between the end side 22-1 and the insulating substrate 21-1 is smaller than a shortest distance between the end side 22-2 and the insulating substrate 21-1. The insulating substrate 21-2 of the two insulating substrates 21 is provided on the end side 22-2 side. Being provided on the end side 22-2 side means that a shortest distance between the end side 22-2 and the insulating substrate 21-2 is smaller than a shortest distance between the end side 22-1 and the insulating substrate 21-2. In this example, a transistor 40-1 and a diode 30-1 are provided above the insulating substrate 21-1. Moreover, in this example, a transistor 40-2 and a diode 30-2 are provided above the insulating substrate 21-2.

The wiring pattern 36 is provided with the transistor 40 or the diode 30. The transistor 40 or the diode 30 is provided on an upper surface of the wiring pattern 36. A bonding material (not shown) such as solder may be provided between the transistor 40 or the diode 30 and the wiring pattern 36.

The wiring pattern 36 includes a plurality of wiring patterns separated from each other. In FIG. 10, the wiring pattern 36 includes a wiring pattern 36-1, a wiring pattern 36-2, a wiring pattern 36-3, a wiring pattern 36-4, and a wiring pattern 36-5. The wiring pattern 36-1 is one example of a first wiring pattern. The wiring pattern 36-4 and the wiring pattern 36-5 are examples of a second wiring pattern. The wiring pattern 36-2 and the wiring pattern 36-3 are examples of a third wiring pattern. The wiring pattern 36-2 is connected to the wiring pattern 36-3. Moreover, the wiring pattern 36-4 is one example of a fourth wiring pattern. The wiring pattern 36-5 is one example of a fifth wiring pattern. The wiring pattern 36-4 is connected to the wiring pattern 36-5. In FIG. 10, the wiring pattern 36-1, the wiring pattern 36-2, and the wiring pattern 36-5 are provided above the insulating substrate 21-1. In FIG. 10, the wiring pattern 36-3 and the wiring pattern 36-4 are provided above the insulating substrate 21-2.

In this example, the P terminal 70, the N terminal 80, and the output terminal 90 have predetermined wiring patterns. The P terminal 70, the N terminal 80, and the output terminal 90 may be connected to another terminal or the like. The P terminal 70 is connected to the wiring pattern 36-1 via the wire 28. The N terminal 80 is connected to the wiring pattern 36-5 via the wire 28. The output terminal 90 is connected to the wiring pattern 36-3 via the wire 28. In this example, the P terminal 70 and the N terminal 80 are provided on the end side 22-1 side. Being provided on the end side 22-1 side means that a shortest distance between each of the terminals and the end side 22-1 is smaller than a shortest distance between each of the terminals and the end side 22-2. Moreover, in this example, the output terminal 90 is provided on the end side 22-2 side. Being provided on the end side 22-2 side means that the shortest distance between each of the terminals and the end side 22-2 is smaller than the shortest distance between each of the terminals and the end side 22-1.

In FIG. 10, the transistor 40 includes the transistor 40-1 and the transistor 40-2. The transistor 40-1 is provided above the wiring pattern 36-1. The transistor 40-1 may be provided on the wiring pattern 36-1. In this example, the three transistors 40-1 are provided on the wiring pattern 36-1. In this example, a collector electrode 44 of the transistor 40-1 is connected to the wiring pattern 36-1. Moreover, in this example, an emitter electrode 42 of the transistor 40-1 is exposed in a top view. The emitter electrode 42 of the transistor 40-1 is connected to the wiring pattern 36-2 via the wire 28 or an anode electrode 32 of the diode 30-1.

The transistor 40-2 is provided above the wiring pattern 36-3. The transistor 40-2 may be provided on the wiring pattern 36-3. In this example, a collector electrode 44 of the transistor 40-2 is connected to the wiring pattern 36-3. In this example, the three transistors 40-2 are provided on the wiring pattern 36-3. Moreover, in this example, an emitter electrode 42 of the transistor 40-2 is exposed in a top view. The emitter electrode 42 of the transistor 40-2 is connected to the wiring pattern 36-4 via the wire 28 or an anode electrode 32 of the diode 30-2.

In FIG. 10, the diode 30 includes the diode 30-1 and the diode 30-2. The diode 30-1 is provided above the wiring pattern 36-1. The diode 30-1 may be provided on the wiring pattern 36-1. In this example, the three diodes 30-1 are provided on the wiring pattern 36-1. In this example, a cathode electrode 34 of the diode 30-1 is connected to the wiring pattern 36-1. Moreover, in this example, the anode electrode 32 of the diode 30-1 is exposed in a top view. The anode electrode 32 of the diode 30-1 is connected to the wiring pattern 36-2 via the wire 28 or the emitter electrode 42 of the transistor 40-1.

The diode 30-2 is provided above the wiring pattern 36-3. The diode 30-2 may be provided on the wiring pattern 36-3. In this example, a cathode electrode 34 of the diode 30-2 is connected to the wiring pattern 36-3. Moreover, in this example, the anode electrode 32 of the diode 30-2 is exposed in a top view. The anode electrode 32 of the diode 30-2 is connected to the wiring pattern 36-4 via the wire 28 or the emitter electrode 42 of the transistor 40-2.

The transistor 40 and the diode 30 may be alternately provided along a predetermined direction. The transistor 40 and the diode 30 may be alternately provided along an X axis direction. The transistor 40 and the diode 30 may be alternately provided along the Y axis direction.

Figure 11:
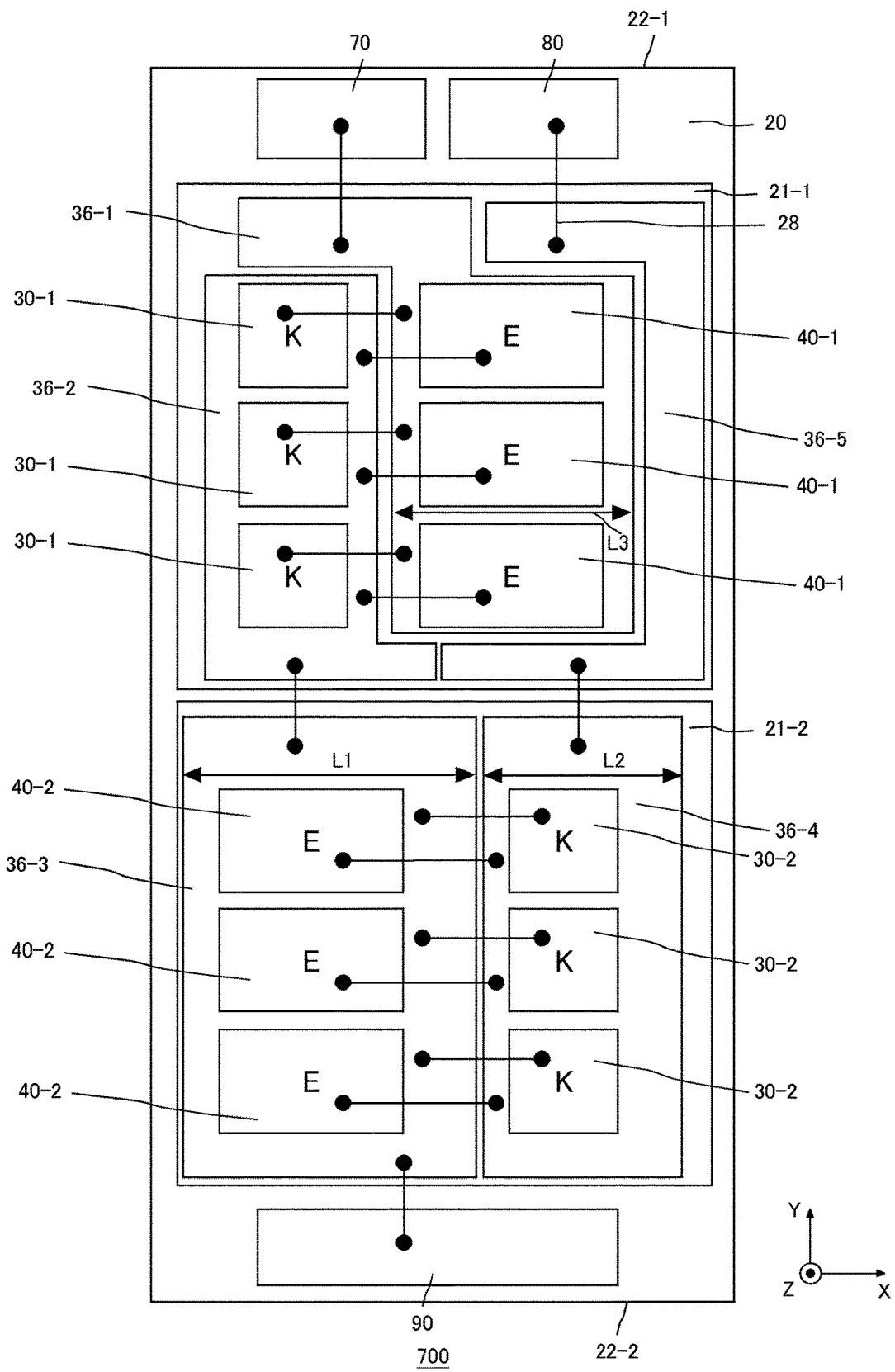
FIG. 11 shows one example of a semiconductor module 700 according to an example embodiment.

FIG. 11 shows one example of a semiconductor module 700 according to an example embodiment. For a configuration shown in FIG. 11 that is similar to the configuration shown in FIG. 10, description will be omitted.

An emitter electrode 42 of a transistor 40-1 is connected to a wiring pattern 36-2 via a wire 28. An emitter electrode 42 of a transistor 40-2 is connected to a wiring pattern 36-4 via the wire 28.

A diode 30-1 is provided above the wiring pattern 36-2. The diode 30-1 may be provided on the wiring pattern 36-2. In this example, three diodes 30-1 are provided on the wiring pattern 36-2. In this example, an anode electrode 32 of the diode 30-1 is connected to the wiring pattern 36-2. Moreover, in this example, a cathode electrode 34 of the diode 30-1 is exposed in a top view. The cathode electrode 34 of the diode 30-1 is connected to a wiring pattern 36-1 via the wire 28.

A diode 30-2 is provided above the wiring pattern 36-4. The diode 30-2 may be provided on the wiring pattern 36-4. In this example, three diodes 30-2 are provided on the wiring pattern 36-4. In this example, an anode electrode 32 of the diode 30-2 is connected to the wiring pattern 36-4. Moreover, in this example, a cathode electrode 34 of the diode 30-2 is exposed in a top view. The cathode electrode 34 of the diode 30-2 is connected to a wiring pattern 36-3 via the wire 28.

With the above configuration, a bridge equilibrium condition can be easily established. Therefore, a radiation noise can be reduced. Therefore, the radiation noise can be reduced only by replacement of a diode 30 without mounting any additional component on the semiconductor module 700.

Moreover, in this example, a width L1 in an X axis direction of the wiring pattern 36-3 is larger than a width L2 in the X axis direction of the wiring pattern 36-4. A width L3 in the X axis direction of the wiring pattern 36-1 may be larger than the width L2 in the X axis direction of the wiring pattern 36-4. A width in the X axis direction of a wiring pattern 36 may be a width in the X axis direction of a region where a transistor 40 or the diode 30 is provided in the wiring pattern 36. Since an area of the transistor 40 in a top view is larger than an area of the diode 30 in a top view, the width L2 in the X axis direction of the wiring pattern 36-4 is smaller than the width L1 in the X axis direction of the wiring pattern 36-3 and the width L3 in the X axis direction of the wiring pattern 36-1. The width of the wiring pattern 36 is provided in this way, so that an area of the wiring pattern 36-1 in a top view can be more easily equalized with a sum of an area of the wiring pattern 36-4 in a top view and an area of a wiring pattern 36-5 in a top view. As such, the bridge equilibrium condition can be easily established.

Figure 12:
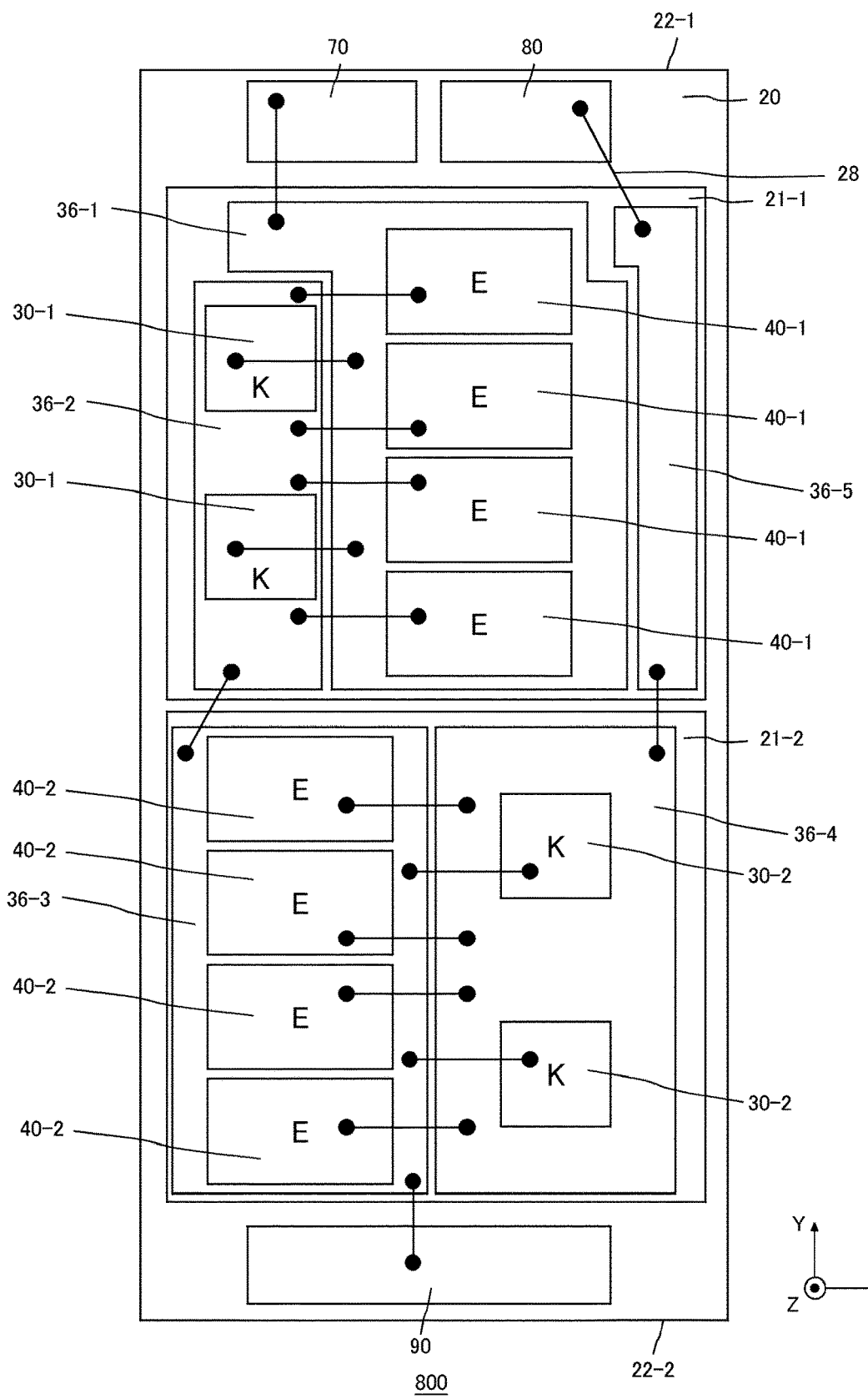
FIG. 12 shows one example of a semiconductor module 800 according to an example embodiment.

FIG. 12 shows one example of a semiconductor module 800 according to an example embodiment. The semiconductor module 800 in FIG. 12 is different from the semiconductor module 700 in FIG. 11 in the number of chips for a transistor 40 and the number of chips for a diode 30. Except for that configuration, the semiconductor module 800 in FIG. 12 may have the same configuration as that of the semiconductor module 700 in FIG. 11.

Four transistors 40-1 may be provided above a wiring pattern 36-1. The four transistors 40-1 may be provided on the wiring pattern 36-1. In this example, collector electrodes 44 of the four transistors 40-1 are connected to the wiring pattern 36-1. Moreover, in this example, emitter electrodes 42 of the four transistors 40-1 are exposed in a top view. The four transistors 40-1 are arrayed in a Y axis direction.

Four transistors 40-2 may be provided above a wiring pattern 36-3. The four transistors 40-2 may be provided on the wiring pattern 36-3. In this example, collector electrodes 44 of the four transistors 40-2 are connected to the wiring pattern 36-3. Moreover, in this example, emitter electrodes 42 of the four transistors 40-2 are exposed in a top view. The four transistors 40-2 are arrayed in the Y axis direction.

Two diodes 30-1 may be provided above a wiring pattern 36-2. The two diodes 30-1 may be provided on the wiring pattern 36-2. In this example, anode electrodes 32 of the two diodes 30-1 are connected to the wiring pattern 36-2. Moreover, in this example, cathode electrodes 34 of the two diodes 30-1 are exposed in a top view. The two diodes 30-1 are arrayed in the Y axis direction.

Two diodes 30-2 may be provided above a wiring pattern 36-4. The two diodes 30-2 may be provided on the wiring pattern 36-4. In this example, anode electrodes 32 of the two diodes 30-2 are connected to the wiring pattern 36-4. Moreover, in this example, cathode electrodes 34 of the two diodes 30-2 are exposed in a top view. The two diodes 30-2 are arrayed in the Y axis direction.

Even if the number of chips for the transistor 40 and the number of chips for the diode 30 are changed in this way, a bridge equilibrium condition can be easily established. Therefore, a radiation noise can be reduced.

Figure 13:
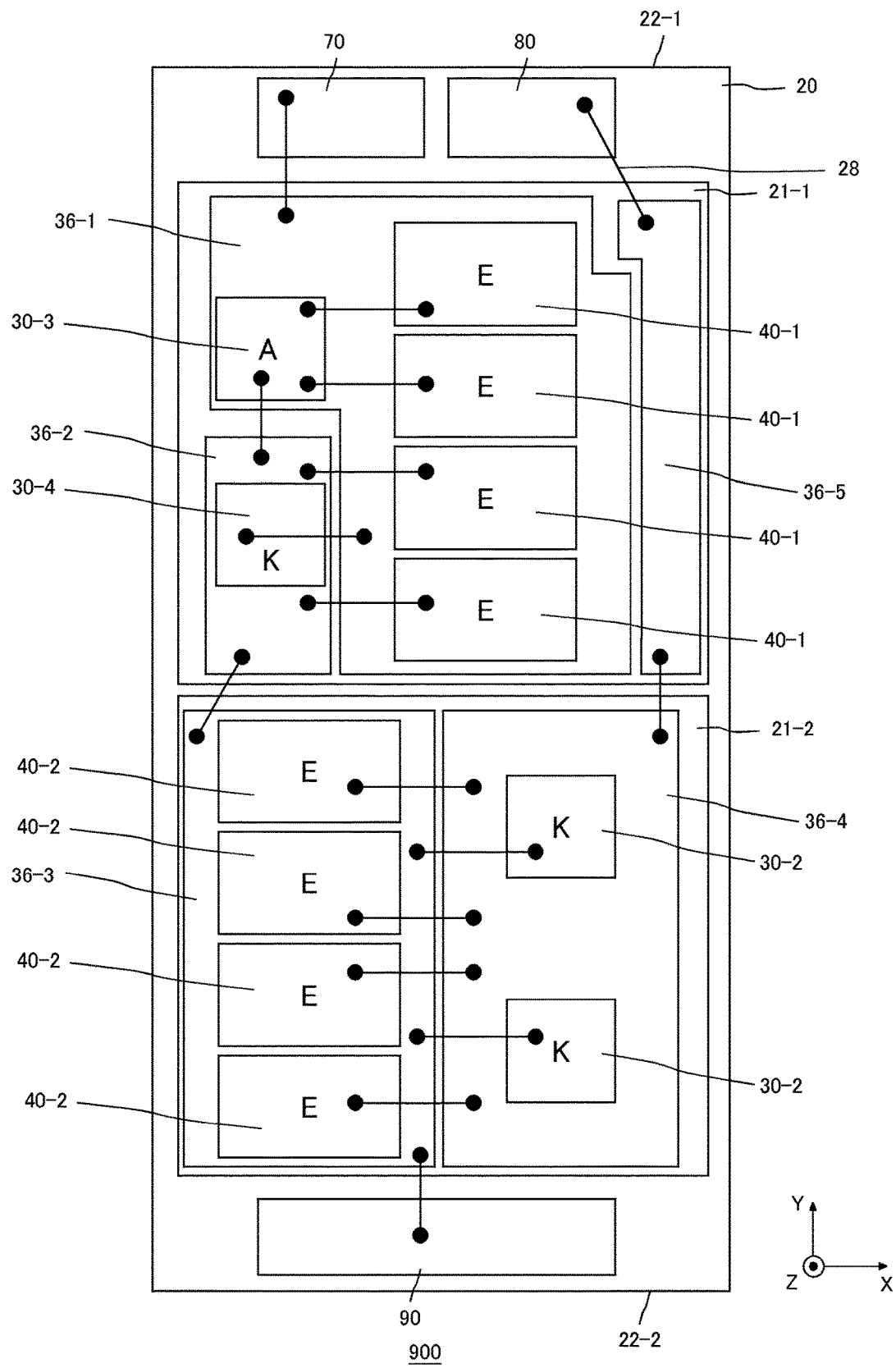
FIG. 13 shows one example of a semiconductor module 900 according to an example embodiment.

FIG. 13 shows one example of a semiconductor module 900 according to an example embodiment. The semiconductor module 900 in FIG. 13 is different from the semiconductor module 800 in FIG. 12 in that a diode 30-3 and a diode 30-4 are provided instead of a diode 30-1 for the former. Except for that configuration, the semiconductor module 900 in FIG. 13 may have the same configuration as that of the semiconductor module 800 in FIG. 12.

The diode 30-3 may be provided above a wiring pattern 36-1. The diode 30-3 may be provided on the wiring pattern 36-1. In this example, a cathode electrode 34 of the diode 30-3 is connected to the wiring pattern 36-1. Moreover, in this example, an anode electrode 32 of the diode 30-3 is exposed in a top view. The anode electrode 32 of the diode 30-3 is connected to a wiring pattern 36-2 via a wire 28.

The diode 30-4 may be provided above the wiring pattern 36-2. The diode 30-4 may be provided on the wiring pattern 36-2. In this example, an anode electrode 32 of the diode 30-4 is connected to the wiring pattern 36-2. Moreover, in this example, a cathode electrode 34 of the diode 30-4 is exposed in a top view. The cathode electrode 34 of the diode 30-4 is connected to the wiring pattern 36-1 via the wire 28.

Even if the diode 30-3 and the diode 30-4 are provided in this way, a bridge equilibrium condition can be easily established. Therefore, a radiation noise can be reduced. Moreover, providing the diode 30-3 and the diode 30-4 can adjust an area of the wiring pattern 36-1 in a top view and an area of the wiring pattern 36-2 in a top view.

Figure 14:
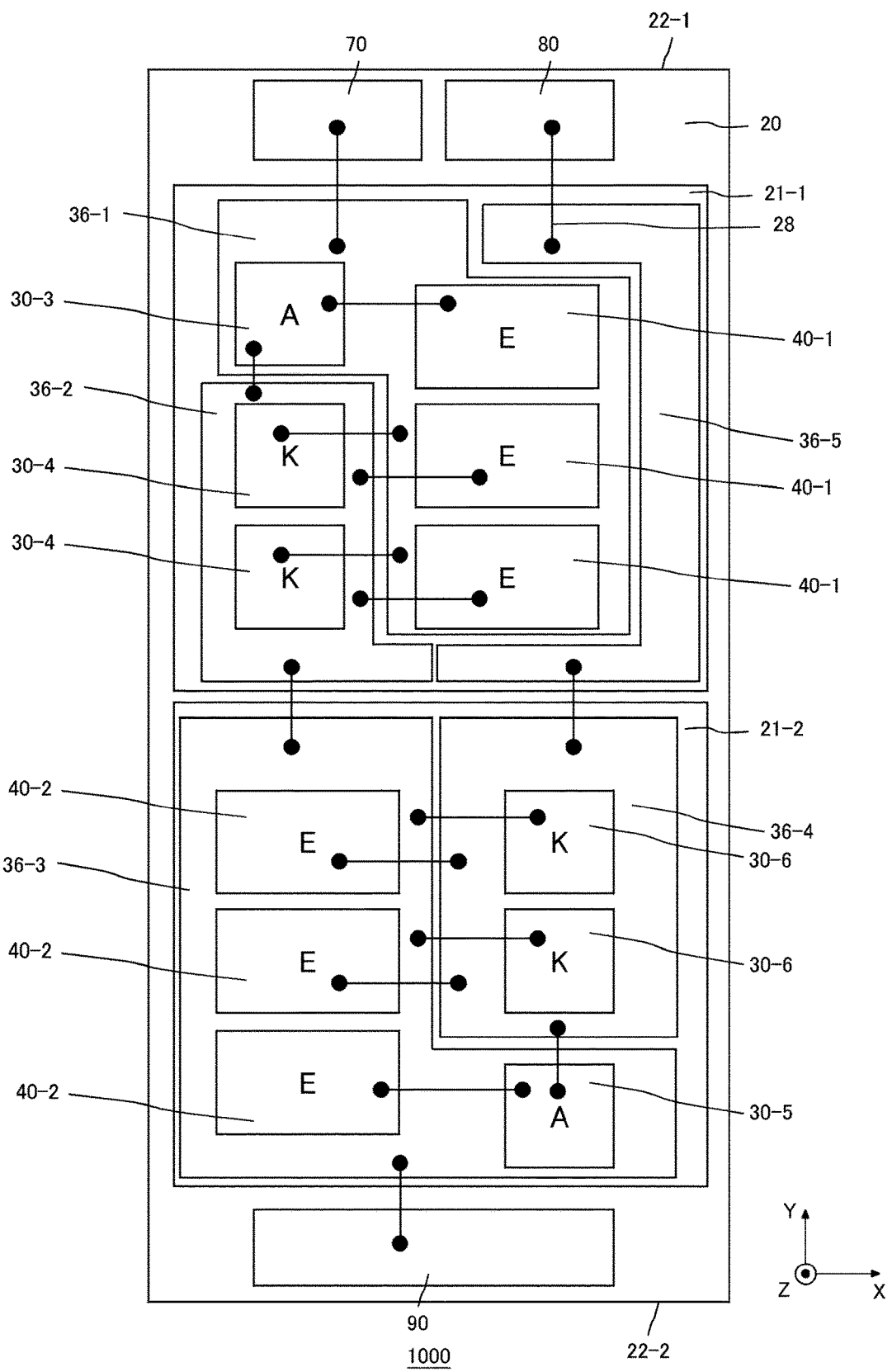
FIG. 14 shows one example of a semiconductor module 1000 according to an example embodiment.

FIG. 14 shows one example of a semiconductor module 1000 according to an example embodiment. The semiconductor module 1000 in FIG. 14 is different from the semiconductor module 700 in FIG. 11 in that a diode 30-3 and a diode 30-4 are provided instead of a diode 30-1 and a diode 30-5 and a diode 30-6 are provided instead of a diode 30-2 for the former. Except for that configuration, the semiconductor module 1000 in FIG. 14 may have the same configuration as that of the semiconductor module 700 in FIG. 11.

The diode 30-3 may be provided above a wiring pattern 36-1. The diode 30-3 may be provided on the wiring pattern 36-1. In this example, one diode 30-3 is provided on the wiring pattern 36-1. In this example, a cathode electrode 34 of the diode 30-3 is connected to the wiring pattern 36-1. Moreover, in this example, an anode electrode 32 of the diode 30-3 is exposed in a top view. The anode electrode 32 of the diode 30-3 is connected to a wiring pattern 36-2 via a wire 28.

The diode 30-4 may be provided above the wiring pattern 36-2. The diode 30-4 may be provided on the wiring pattern 36-2. In this example, two diodes 30-4 are provided on the wiring pattern 36-2. In this example, an anode electrode 32 of the diode 30-4 is connected to the wiring pattern 36-2. Moreover, in this example, a cathode electrode 34 of the diode 30-4 is exposed in a top view. The cathode electrode 34 of the diode 30-4 is connected to the wiring pattern 36-1 via the wire 28.

The diode 30-5 may be provided above a wiring pattern 36-3. The diode 30-5 may be provided on the wiring pattern 36-3. In this example, one diode 30-5 is provided on the wiring pattern 36-3. In this example, a cathode electrode 34 of the diode 30-5 is connected to the wiring pattern 36-3. Moreover, in this example, an anode electrode 32 of the diode 30-5 is exposed in a top view. The anode electrode 32 of the diode 30-5 is connected to a wiring pattern 36-4 via the wire 28.

The diode 30-6 may be provided above the wiring pattern 36-4. The diode 30-6 may be provided on the wiring pattern 36-4. In this example, two diodes 30-6 are provided on the wiring pattern 36-4. In this example, an anode electrode 32 of the diode 30-6 is connected to the wiring pattern 36-4. Moreover, in this example, a cathode electrode 34 of the diode 30-6 is exposed in a top view. The cathode electrode 34 of the diode 30-6 is connected to the wiring pattern 36-3 via the wire 28.

In this example, the total number of chips for a transistor 40 and a diode 30 provided to the wiring pattern 36-1 is different from the total number of chips for the transistor 40 and the diode 30 provided to the wiring pattern 36-4. Therefore, an area of the wiring pattern 36-1 in a top view can be more easily equalized with a sum of an area of the wiring pattern 36-4 in a top view and an area of a wiring pattern 36-5 in a top view. In this way, the total number of chips for the transistor 40 and the diode 30 provided to a wiring pattern 36 can be flexibly changed.

Figure 15:
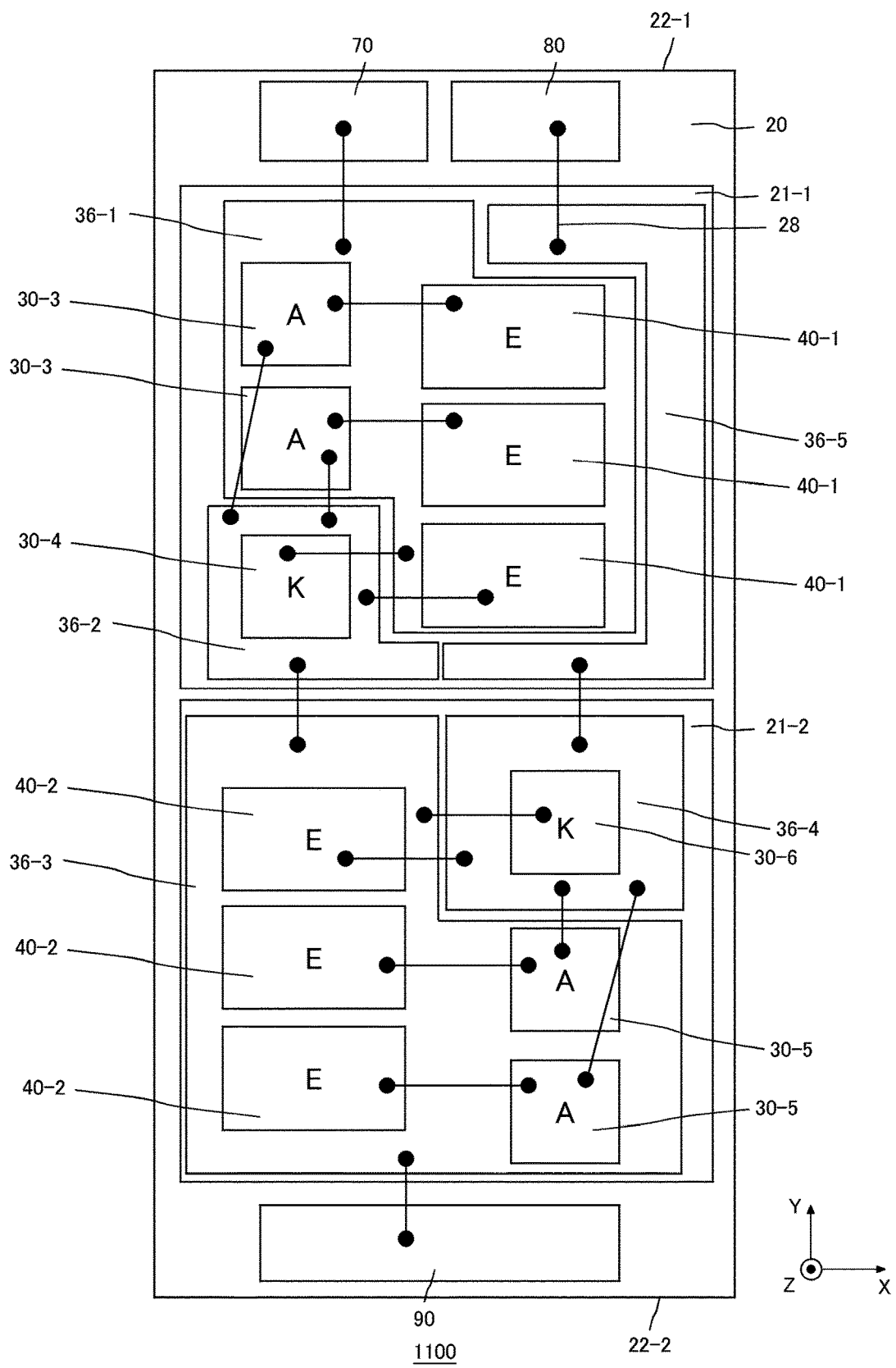
FIG. 15 shows one example of a semiconductor module 1100 according to an example embodiment.

FIG. 15 shows one example of a semiconductor module 1100 according to an example embodiment. The semiconductor module 1100 in FIG. 15 is different from the semiconductor module 1000 in FIG. 14 in the number of chips for each of a diode 30-1, a diode 30-2, a diode 30-3, and a diode 30-4. Except for that configuration, the semiconductor module 1100 in FIG. 15 may have the same configuration as that of the semiconductor module 1000 in FIG. 14.

In this example, two diodes 30-3 are provided on a wiring pattern 36-1. Moreover, in this example, one diode 30-4 is provided on a wiring pattern 36-2. Similarly, two diodes 30-5 are provided on a wiring pattern 36-3, and one diode 30-6 is provided on a wiring pattern 36-4. In this way, as in the semiconductor module 1000 in FIG. 14, the total number of chips for a transistor 40 and a diode 30 provided to a wiring pattern 36 can be flexibly changed.

It should be noted that the number of chips for the diode 30 provided on the wiring pattern 36-1 may be different from the number of chips for the diode 30 provided on the wiring pattern 36-3. For example, the number of chips for the diode 30 provided on the wiring pattern 36-1 is one, and the number of chips for the diode 30 provided on the wiring pattern 36-3 is two. In this case, the number of chips for the diode 30 provided on the wiring pattern 36-2 is two, and the number of chips for the diode 30 provided on the wiring pattern 36-4 is one. The number of chips for the diode 30 provided on the wiring pattern 36 can be changed as required.

Figure 16:
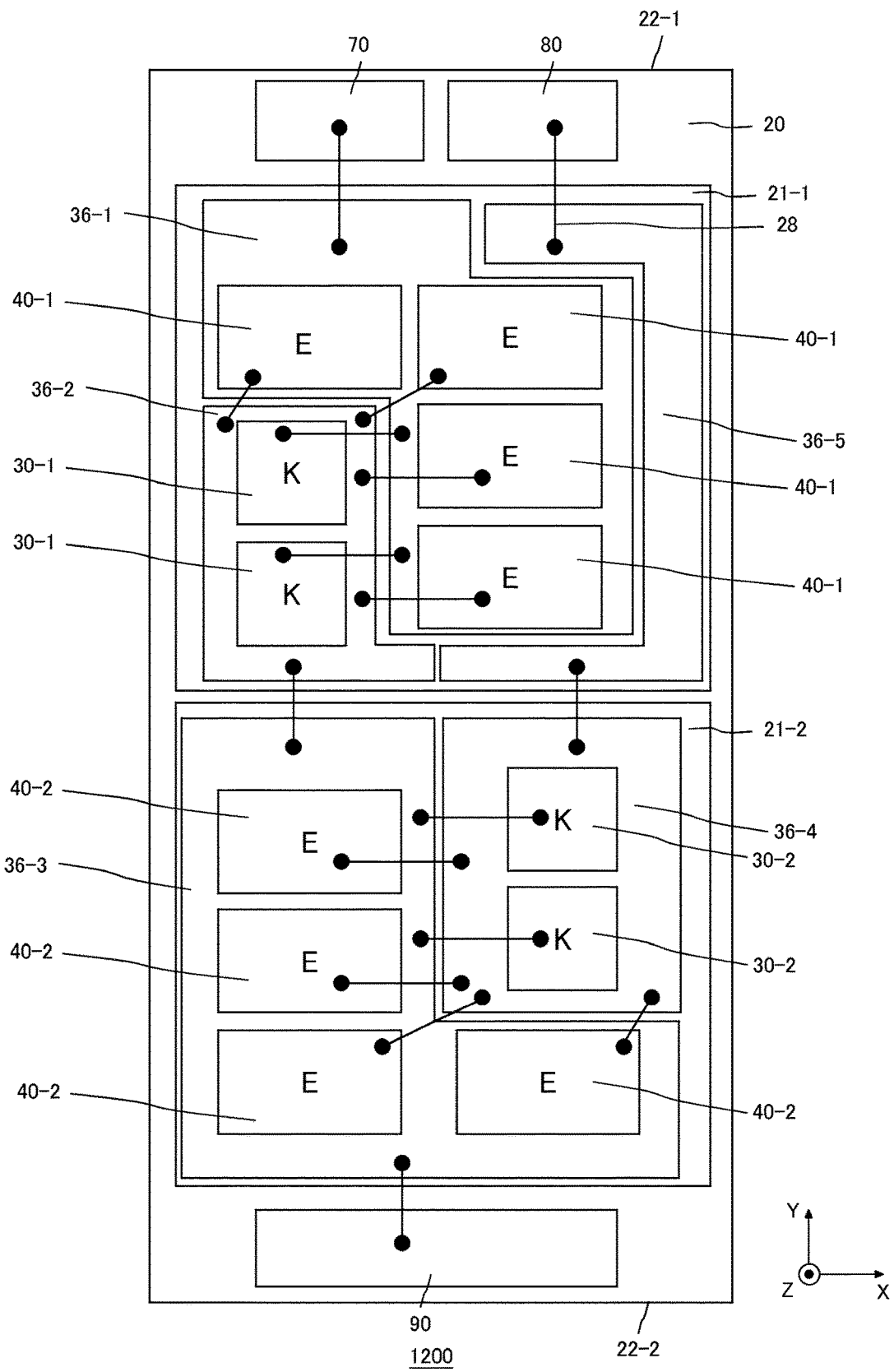
FIG. 16 shows one example of a semiconductor module 1200 according to an example embodiment.

FIG. 16 shows one example of a semiconductor module 1200 according to an example embodiment. The semiconductor module 1200 in FIG. 16 is different from the semiconductor module 800 in FIG. 12 in arrangement of a transistor 40 and a diode 30. Except for that configuration, the semiconductor module 1200 in FIG. 16 may have the same configuration as that of the semiconductor module 800 in FIG. 12.

In this example, three transistors 40-1 are arrayed in a Y axis direction above an insulating substrate 21-1. Moreover, in this example, one transistor 40-1 and two diodes 30-1 are arrayed in the Y axis direction above the insulating substrate 21-1. Moreover, in this example, three transistors 40-2 are arrayed in the Y axis direction above an insulating substrate 21-2. Moreover, in this example, one transistor 40-2 and two diodes 30-2 are arrayed in the Y axis direction above the insulating substrate 21-2. Changing the arrangement of the transistor 40 and the diode 30 can flexibly change an area of a wiring pattern 36 in a top view.

Figure 17:
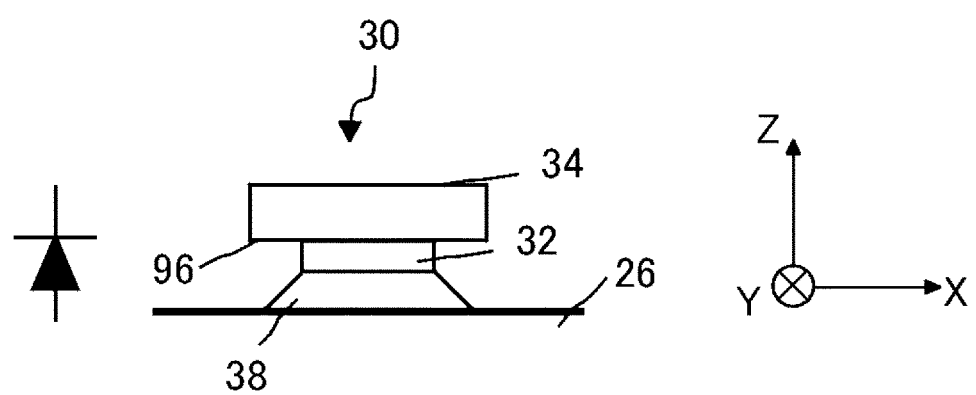
FIG. 17 shows arrangement of a diode 30 in FIG. 5 in detail.

FIG. 17 shows the arrangement of the diode 30 in FIG. 5 in detail. A bonding material 38 is provided between the diode 30 and the wiring pattern 26. The bonding material 38 is, for example, solder. The anode electrode 32 of the diode 30 is connected to the wiring pattern 26 via the bonding material 38.

A guard ring 96 is provided on the anode electrode 32 side of the diode 30. Therefore, in order to ensure a breakdown voltage with the wiring pattern 26, the guard ring 96 is preferably provided with an insulating film or the like. Therefore, the diode 30 in FIG. 5 has a different structure from that of the diode 30 in FIG. 1. In FIG. 5, the anode electrodes 32 of the two diodes 30 are provided on the lower surface, so that the two diodes 30 can have the same structure. Therefore, the number of components can be reduced.

Figure 18:
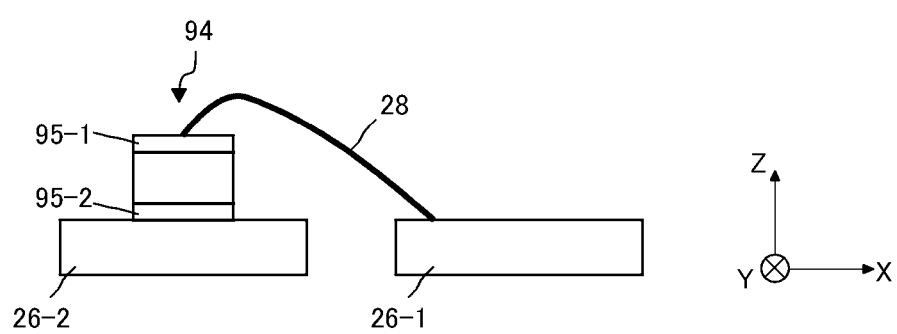
FIG. 18 shows arrangement of a chip capacitor 94 in FIG. 9 in detail.

FIG. 18 shows the arrangement of the chip capacitor 94 in FIG. 9 in detail. The chip capacitor 94 is provided with an electrode 95. In this example, an electrode provided on an upper surface of the chip capacitor 94 is defined as an electrode 95-1, while an electrode provided on a lower surface of the chip capacitor 94 is defined as an electrode 95-2. That is, the chip capacitor 94 is a vertical chip. The electrode 95-2 of the chip capacitor 94 is connected to the wiring pattern 26-2. The electrode 95-1 of the chip capacitor 94 is connected to the wiring pattern 26-1 via the wire 28.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

What is claimed is:

1. A semiconductor module having a P-side arm circuit and an N-side arm circuit, the semiconductor module comprising:
    a P terminal on a high-voltage side;
    an N terminal on a low-voltage side;
    a plurality of wiring patterns separated from each other; and
    a transistor and a diode connected in parallel in each of the P-side arm circuit and the N-side arm circuit, wherein
        the plurality of wiring patterns include a first wiring pattern, a second wiring pattern, and a third wiring pattern,
        the P terminal is connected to the first wiring pattern,
        the N terminal is connected to the second wiring pattern,
        an anode electrode of the diode of the N-side arm circuit is arranged above the second wiring pattern and is connected to the second wiring pattern, and
        an anode electrode of the diode of the P-side arm circuit is arranged above the third wiring pattern and is connected to the third wiring pattern.

2. The semiconductor module according to claim 1, wherein
    a collector electrode of the transistor of the P-side arm circuit is arranged above the first wiring pattern and is connected to the first wiring pattern.

3. The semiconductor module according to claim 2, wherein
    a collector electrode of the transistor of the N-side arm circuit is arranged above a wiring pattern different from the first wiring pattern and is connected to the wiring pattern.

4. The semiconductor module according to claim 2, comprising a plurality of wires, wherein
    one wire of the plurality of wires is configured to connect a cathode electrode of the diode of the N-side arm circuit and the third wiring pattern.

5. The semiconductor module according to claim 2, wherein
    an area of the first wiring pattern in a top view and an area of the second wiring pattern in a top view are nearly equal.

6. The semiconductor module according to claim 2, wherein
    a total number of chips for the transistor and the diode provided to the first wiring pattern is same as a total number of chips for the transistor and the diode provided to the second wiring pattern.

7. The semiconductor module according to claim 2, further comprising a chip capacitor provided across the first wiring pattern and the second wiring pattern.

8. The semiconductor module according to claim 2, further comprising an output terminal configured to output a voltage to an outside, wherein
    the output terminal is connected to the third wiring pattern.

9. The semiconductor module according to claim 2, further comprising:
    an output terminal configured to output a voltage to an outside;
    a base substrate having one end side and an other end side facing each other; and
    two insulating substrates provided above the base substrate, wherein
        the output terminal is connected to the third wiring pattern,
        the P terminal and the N terminal are provided on the one end-side side,
        the output terminal is provided on the other end-side side,
        the second wiring pattern includes:
            a fourth wiring pattern provided above an insulating substrate on the other end-side side of the two insulating substrates; and
            a fifth wiring pattern provided above an insulating substrate on the one end-side side of the two insulating substrates,
        the anode electrode of the diode of the N-side arm circuit is arranged above the fourth wiring pattern and is connected to the fourth wiring pattern, and
        the fifth wiring pattern is connected to the fourth wiring pattern and the N terminal.

10. The semiconductor module according to claim 1, wherein
    a collector electrode of the transistor of the N-side arm circuit is arranged above a wiring pattern different from the first wiring pattern and is connected to the wiring pattern.

11. The semiconductor module according to claim 10, wherein
    the collector electrode of the transistor of the N-side arm circuit is arranged above the third wiring pattern and is connected to the third wiring pattern.

12. The semiconductor module according to claim 1, comprising a plurality of wires, wherein
    one wire of the plurality of wires is configured to connect a cathode electrode of the diode of the N-side arm circuit and the third wiring pattern.

13. The semiconductor module according to claim 12, comprising a plurality of wires, wherein
    one wire of the plurality of wires is configured to connect a cathode electrode of the diode of the P-side arm circuit and the first wiring pattern.

14. The semiconductor module according to claim 1, wherein
an area of the first wiring pattern in a top view and an area of the second wiring pattern in a top view are nearly equal.

15. The semiconductor module according to claim 1, wherein
a total number of chips for the transistor and the diode provided to the first wiring pattern is same as a total number of chips for the transistor and the diode provided to the second wiring pattern.

16. The semiconductor module according to claim 15, wherein
the total number of chips for the transistor and the diode provided to the first wiring pattern is one, and
the total number of chips for the transistor and the diode provided to the second wiring pattern is one.

17. The semiconductor module according to claim 16, wherein
one of the transistor is provided on the first wiring pattern, and
one of the diode is provided on the second wiring pattern.

18. The semiconductor module according to claim 1, further comprising a chip capacitor provided across the first wiring pattern and the second wiring pattern.

19. The semiconductor module according to claim 1, further comprising an output terminal configured to output a voltage to an outside, wherein
the output terminal is connected to the third wiring pattern.

20. The semiconductor module according to claim 1, further comprising:
an output terminal configured to output a voltage to an outside;
a base substrate having one end side and an other end side facing each other; and
two insulating substrates provided above the base substrate, wherein
the output terminal is connected to the third wiring pattern,
the P terminal and the N terminal are provided on the one end-side side,
the output terminal is provided on the other end-side side,
the second wiring pattern includes:
a fourth wiring pattern provided above an insulating substrate on the other end-side side of the two insulating substrates; and
a fifth wiring pattern provided above an insulating substrate on the one end-side side of the two insulating substrates,
the anode electrode of the diode of the N-side arm circuit is arranged above the fourth wiring pattern and is connected to the fourth wiring pattern, and
the fifth wiring pattern is connected to the fourth wiring pattern and the N terminal.

* * * * *